(12) United States Patent
Xue et al.

(10) Patent No.: US 11,249,595 B2
(45) Date of Patent: Feb. 15, 2022

(54) SHIFT REGISTER UNIT, GATE DRIVING CIRCUIT AND DRIVING METHOD

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Wei Xue, Beijing (CN); Silin Feng, Beijing (CN); Zhifu Dong, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

(*) Notice: Subject to any disclaimer, the term of this patent is extended or adjusted under 35 U.S.C. 154(b) by 588 days.

(21) Appl. No.: 16/307,851

(22) PCT Filed: Apr. 17, 2018

(86) PCT No.: PCT/CN2018/083423
§ 371 (c)(1),
(2) Date: Dec. 6, 2018

(87) PCT Pub. No.: WO2019/041827
PCT Pub. Date: Mar. 7, 2019

(65) Prior Publication Data
US 2021/0225252 A1    Jul. 22, 2021

(30) Foreign Application Priority Data
Aug. 28, 2017    (CN) .......................... 201710751117.7

(51) Int. Cl.
*G06F 3/041*    (2006.01)
*G09G 3/20*    (2006.01)

(52) U.S. Cl.
CPC ...... *G06F 3/04184* (2019.05); *G06F 3/04164* (2019.05); *G09G 3/2092* (2013.01);
(Continued)

(58) Field of Classification Search
CPC ......... G09G 3/2092; G09G 2300/0426; G09G 2310/0426; G09G 2310/0286; G09G 2310/061; G09G 2310/08; G09F 3/04164
(Continued)

(56) References Cited

U.S. PATENT DOCUMENTS

2016/0372069 A1    12/2016    Lv et al.
2016/0379586 A1    12/2016    Wu et al.
(Continued)

FOREIGN PATENT DOCUMENTS

CN    105741742 A    *    7/2016
CN    105741742 A        7/2016
(Continued)

OTHER PUBLICATIONS

The Chinese Patent Office first Office Action dated Feb. 25, 2020 Appln 201710751117.7.
(Continued)

*Primary Examiner* — Mark Edwards

(57) ABSTRACT

Provided are a shift register unit of a gate driving circuit (GOA), a gate driving circuit and a driving method. The shift register unit includes an input sub-circuit, configured to output an input signal to a first node; a pull-up control sub-circuit, configured to charge a pull-up node through a first power supply terminal under the control of a potential of the first node; an output sub-circuit, configured to output a clock signal of a clock signal terminal to an output terminal under the control of a potential of the pull-up node; a first touch control sub-circuit configured to pull down levels of the pull-up node and the output terminal to a second poten-
(Continued)

tial through the second power supply terminal under the control of a touch control keeping signal of the touch control keeping signal terminal.

19 Claims, 11 Drawing Sheets

(52) U.S. Cl.
CPC .............. *G09G 2300/0426* (2013.01); *G09G 2310/0286* (2013.01); *G09G 2310/061* (2013.01); *G09G 2310/08* (2013.01)

(58) Field of Classification Search
USPC ........................................................ 345/204
See application file for complete search history.

(56) References Cited

U.S. PATENT DOCUMENTS

| | | |
|---|---|---|
| 2017/0124976 A1 | 5/2017 | Chen |
| 2018/0190364 A1 | 7/2018 | Gu et al. |

FOREIGN PATENT DOCUMENTS

| | | | | |
|---|---|---|---|---|
| CN | 106023945 A | * | 10/2016 | |
| CN | 106023945 A | | 10/2016 | |
| CN | 106531052 A | * | 3/2017 | ........... G11C 19/184 |
| CN | 106531052 A | | 3/2017 | |
| CN | 104575438 B | | 5/2017 | |
| CN | 206388486 U | * | 8/2017 | ........... G09G 3/3677 |
| CN | 206388486 U | | 8/2017 | |
| EP | 3573047 A1 | | 11/2019 | |

OTHER PUBLICATIONS

Extended European Search Report dated Feb. 12, 2021; Appln. No. 18807545.1.

* cited by examiner

SHIFT REGISTER UNIT, GATE DRIVING CIRCUIT AND DRIVING METHOD

CROSS-REFERENCE TO RELATED APPLICATION

The present application claims the priority of a Chinese patent application No. 201710751117.7 filed on Aug. 28, 2017. Herein, the content disclosed by the Chinese patent application is incorporated in full by reference as a part of the present application.

TECHNICAL FIELD

The present disclosure relates to a shift register unit, a gate driving circuit comprising the shift register unit and a driving method applicable to the shift register unit.

BACKGROUND

During operation of a touch display screen, in order not to influence the touch control effect, respective stages of shift register units of a gate driving circuit do not output gate output signal during reception of a touch control keeping signal.

In the design of the existing gate driving circuit, during reception of a touch control keeping signal, respective stages of shift register units only pull down an output terminal to a low level, so as to prevent unnecessary gate driving output. During that period, an output capacitor is still in a charging state. Therefore, during operation of the touch display screen, leakage of electricity is likely to occur to the output capacitor, thereby causing that the touch control effect is affected during the touch control period of time.

SUMMARY

In view of the above problems, there are provided in the present disclosure a shift register unit, a gate driving circuit comprising the shift register unit and a driving method applicable to the shift register unit. The shift register unit is capable of discharging an output capacitor during the touch control period of time, keeping the two terminals (output terminal and pull-up node) of the output capacitor to be pulled down to the low level during the touch control period of time, so as to prevent a gate driving output from interfering the touch control effect during the touch control period of time. In addition, an input signal of a row is preserved during the touch control period of time, so that the signal of the row is normally output after the end of a touch control phase.

According to one aspect of the present disclosure, there is provided a shift register unit, comprising: an input sub-circuit, configured to output an input signal to a first node (PH); a pull-up control sub-circuit having a first terminal connected to the first node (PH), a second terminal connected to a pull-up node (PU), and a third terminal connected to a first power supply terminal (VDD), and configured to charge the pull-up node (PU) through the first power supply terminal (VDD) under the control of a potential of the first node (PH); an output sub-circuit having a first terminal connected to the pull-up node (PU), a second terminal connected to a clock signal terminal (CLK), and a third terminal connected to an output terminal, and configured to output a clock signal of the clock signal terminal (CLK) to the output terminal under the control of a potential of the pull-up node (PU); a first touch control sub-circuit having a first terminal connected to a touch control keeping signal terminal, a second terminal connected to the pull-up node PU, a third terminal connected to the output terminal, and a fourth terminal connected to a second power supply terminal (VGL), and configured to pull down levels of the pull-up node (PU) and the output terminal to a second potential through the second power supply terminal (VGL) under the control of a touch control keeping signal of the touch control keeping signal terminal.

In one embodiment, the shift register unit further comprises: a second touch control sub-circuit having a first terminal connected to the touch control keeping signal terminal, and a second terminal connected to the first node (PH), and configured to output the touch control keeping signal of the touch control keeping signal terminal to the first node (PH) under the control of the touch control keeping signal.

In one embodiment, the shift register unit further comprises: an input keeping sub-circuit having a first terminal connected to the first node (PH), and a second terminal connected to the second power supply terminal (VGL), and configured to keep a level of the first node (PH).

In one embodiment, the input keeping sub-circuit further comprises a third terminal which is connected to the output terminal.

In one embodiment, the shift register unit further comprises: a pull-down control sub-circuit having a first terminal connected to the pull-up node (PU), a second terminal connected to the second power supply terminal (VGL), and a third terminal connected to a third power supply terminal (GCH), and configured to control a level of the pull-down node (PD); a pull-down sub-circuit having a first terminal connected to the pull-down node (PD), a second terminal connected to the pull-up node (PU), a third terminal connected to the output terminal, and a fourth terminal connected to the second power supply terminal (VGL), and configured to pull down levels of the pull-up node (PU) and the output terminal to the second potential through the second power supply terminal (VGL) under the control of a potential of the pull-down node (PD).

In one embodiment, the shift register unit further comprises: a reset sub-circuit having a first terminal connected to a reset signal terminal (Reset), a second terminal connected to the pull-up node (PU), and a third terminal connected to the second power supply terminal (VGL), and configured to reset the pull-up node (PU) under the control of a potential of the reset signal terminal.

According to another aspect of the present disclosure, there is provided a driving method applicable to the shift register unit described above, comprising: an input phase, during which an input sub-circuit receives an input signal; the input signal is output to a first node (PH) through the input sub-circuit; a pull-up control sub-circuit charges a pull-up node (PU) through a first power supply terminal (VDD) under the control of a potential of the first node (PH); a touch control phase, during which the first touch control sub-circuit receives a touch control keeping signal; the touch control keeping signal controls the first touch control sub-circuit to pull down the pull-up node (PU) and an output terminal to a second potential.

In one embodiment, in the touch control phase, the driving method further comprises: the second touch control sub-circuit receives the touch control keeping signal; the touch control keeping signal controls the second touch control sub-circuit to keep the potential of the first node (PH).

In one embodiment, in the touch control phase, the driving method further comprises: an input keeping sub-circuit keeps the potential of the first node (PH) unchanged when the first node (PH) is charged to a first potential state.

In one embodiment, the driving method further comprises: a recovery phase, during which a pull-up control sub-circuit outputs a first power supply signal to the pull-up node under the control of the potential of the first node (PH); and an output phase, during which the output sub-circuit outputs a clock signal to the output terminal under the control of a potential of the pull-up node (PU).

In one embodiment, the driving method further comprises: a reset phase, during which a reset sub-circuit pulls down the pull-up node (PU) to a second potential under the control of a potential of a reset signal terminal.

According to another aspect of the present disclosure, there is provided a gate driving circuit applicable to the shift register unit as described above, comprising N stages of shift register units connected in cascades, wherein an input terminal of an i-th stage of shift register unit is connected to an output terminal of an (i−1)-th stage of shift register unit, an output terminal of the i-th stage of shift register unit is connected to a reset terminal of the (i−1)-th stage of shift register unit, where N is an integer greater than 2, $1 < i \leq N$; an input terminal of a first stage of shift register unit is connected to a frame input signal control terminal; a reset terminal of an N-th stage of shift register unit is connected to a frame reset signal control terminal.

By utilizing the shift register unit, the gate driving circuit and the driving method provided in the present disclosure, it is capable of discharging the output capacitor of the shift register unit during the touch control phase, so that the two terminals (output terminal and pull-up node) of the output capacitor keep at a low level during the touch control phase, so as to prevent the shift register unit from outputting a gate driving signal that interferes the touch control effect during the touch control phase. Additionally, the input signal of the row is preserved during the touch control phase, so as to ensure the shift register unit outputting a gate driving signal corresponding to the kept input signal after the end of the touch control phase.

BRIEF DESCRIPTION OF THE DRAWINGS

In order to describe technical solutions of embodiments of the present disclosure more clearly, accompanying figures needed to be used in description of embodiments will be introduced below briefly. Obviously, the accompanying figures in the following description are just some embodiments of the present disclosure. For those ordinary skilled in the art, other accompanying figures can be obtained from these accompanying figures without paying any inventive labor. The following figures are not drawn and scaled according to the actual size, and the key point is to present the substances of the present disclosure.

DETAILED DESCRIPTION

In order to make purposes, technical solutions and advantages of embodiments of the present disclosure more clear, technical solutions in the embodiments of the present disclosure will be described clearly and completely by combining with the accompanying figures. Obviously, the embodiments described below are just a part of embodiments of the present disclosure, but not all the embodiments. Based on the embodiments of the present disclosure, all the other embodiments obtained by those ordinary skilled in the art without paying any inventive labor also belong to the scope sought for protection in the present disclosure.

Unless otherwise defined, technical terms or scientific terms used herein shall have common meanings understood by those ordinary skilled in the art. "First", "second" and similar words used in the present disclosure do not indicate any sequence, amount or importance, but are just used to distinguish different component parts. Also, "include" or "comprise" or other similar words means that an element or object prior to the word covers elements or objects or equivalents thereof listed subsequent to the word, but do not exclude other elements or objects. "Connect" or "connected to" or other similar words are not limited to physical or mechanical connection, but can comprise electrical connection, regardless of direct connection or indirect connection. "Up", "down", "left", and "right" and so on are just used to indicate a relative position relationship. When an absolute position of a described object is changed, this relative position relationship is likely to be changed correspondingly.

Figure 1:
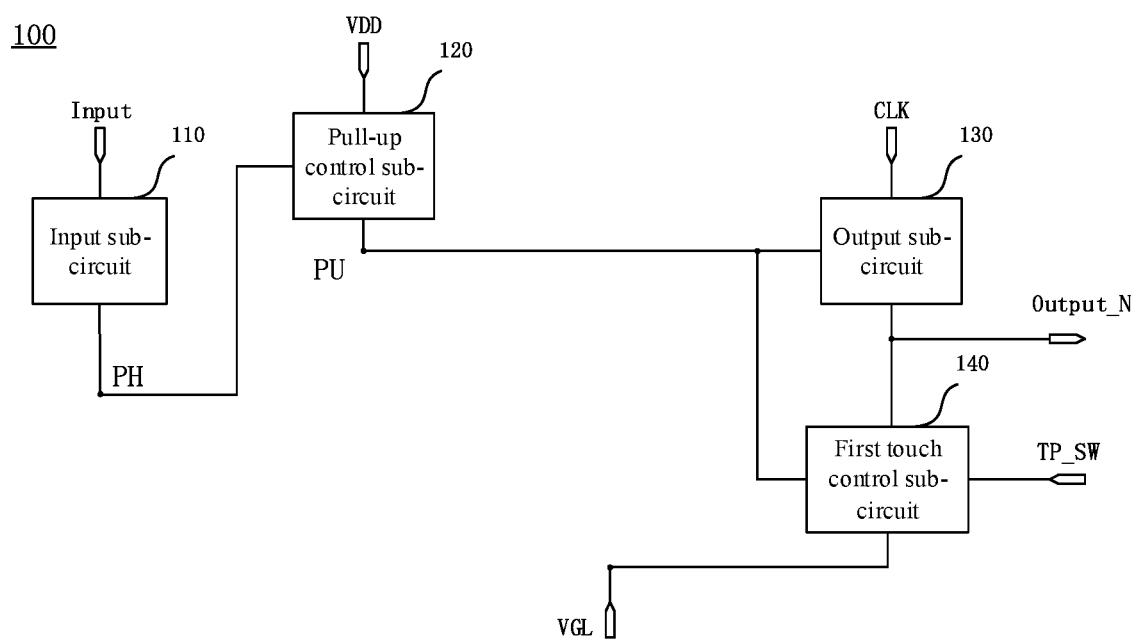
FIG. 1 is a schematic diagram of a shift register unit according to some embodiments of the present disclosure.

FIG. 1 is a schematic block diagram of a shift register unit according to an embodiment of the present disclosure. As shown in FIG. 1, the shift register unit 100 comprises: an input sub-circuit 110, configured to receive an input signal and output the input signal to a first node PH; a pull-up control sub-circuit 120, wherein a first terminal of the pull-up control sub-circuit 120 is connected to the first node PH, a second terminal of the pull-up control sub-circuit 120 is connected to a pull-up node PU, and a third terminal of the pull-up control sub-circuit 120 is connected to a first power supply terminal VDD, and the pull-up control sub-circuit 120 is configured to charge the pull-up node PU through the first power supply terminal VDD under the control of a potential of the first node PH; an output sub-circuit 130, wherein a first terminal of the output sub-circuit 130 is connected to the pull-up node PU, a second terminal of the output sub-circuit 130 is connected to a clock signal terminal CLK, and a third terminal of the output sub-circuit 130 is connected to an output terminal Output_N, and the output sub-circuit 130 is configured to output a clock signal of the clock signal terminal CLK to the output terminal Output_N under the control of a potential of the pull-up node PU; a first touch control sub-circuit 140, wherein a first terminal of the first touch control sub-circuit 140 is connected to a touch control keeping signal terminal TP_SW, a second terminal first touch control sub-circuit 140 is connected to the pull-up node PU, a third terminal first touch control sub-circuit 140 is connected to the output terminal Output_N, and a fourth terminal first touch control sub-circuit 140 is connected to a second power supply terminal VGL, and the first touch control sub-circuit 140 is configured to pull down levels of the pull-up node PU and the output terminal Output_N to a potential of the second power supply terminal VGL through the second power supply terminal VGL under the control of a touch control keeping signal of the touch control keeping signal terminal TP_SW. In some embodiments, the first power supply terminal VDD is always input a voltage signal of a first potential, and the second power supply terminal is always input a voltage signal of a second potential.

In some embodiments, if transistors used in the shift register units are N type transistors, then the first potential is a high level and the second potential is a low level. In some other embodiments, if transistors used in the shift register unit are P type transistors, then the first potential is a low level and the second potential is a high level.

The shift register unit 100 according to the present disclosure is capable of keeping the output terminal Output_N and the pull-up node PU at a low level during the touch control period of time, so as to prevent the shift register unit from outputting a gate driving signal that interferes the touch control effect during the touch control period of time.

It can be understood that the touch control keeping signal output by the touch control keeping signal terminal TP_SW is a pulse signal, and its effective level time period is consistent with an effective level time period of the touch control signal.

Figure 2:
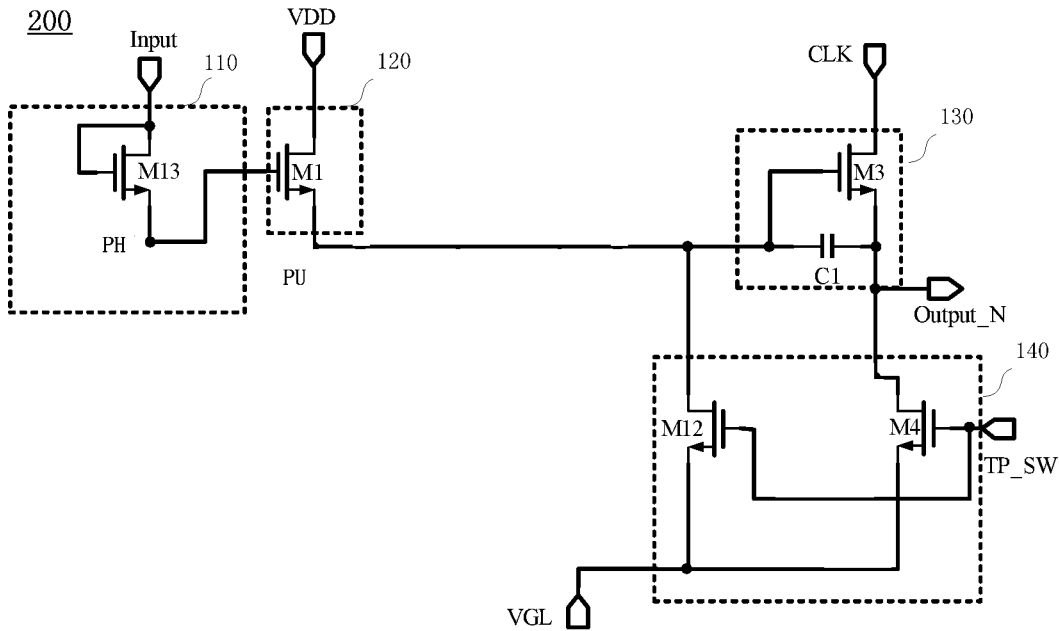
FIG. 2 illustrates an exemplary circuit structure diagram of a shift register unit according to some embodiments of the present disclosure.

FIG. 2 illustrates an exemplary circuit structure of a shift register unit according to an embodiment of the present disclosure. The circuit structure of the shift register unit will be describe below in detail by combining with FIGS. 1 and 2.

As shown in FIG. 2, in one embodiment, the input sub-circuit 110 comprises an input transistor M13, wherein a gate of the input transistor M13 is connected to a first electrode and is connected to an input terminal of the shift register unit; the output sub-circuit 140 comprises an output transistor M3 and an output capacitor C1, wherein a gate of the output transistor M3 is connected to a first terminal of the output capacitor C1 and is connected to the pull-up node PU, a second terminal of the output capacitor C1 is connected to a second terminal of the output capacitor C1 and is connected to the output terminal Output_N of the shift register unit, and the second terminal of the output transistor M3 is connected to the clock signal terminal CLK.

In one embodiment, the first touch control sub-circuit 140 comprises a first touch control transistor M4 and a second touch control transistor M12, wherein a gate of the first touch control transistor M4 is connected to the touch control keeping signal terminal TP_SW, a first electrode of the first touch control transistor M4 is connected to the output terminal Output_N, and a second electrode of the first touch control transistor M4 is connected to the second power supply terminal VGL, and a gate of the second touch control transistor M12 is connected to the touch control keeping signal terminal TP_SW, a first electrode of the second touch control transistor M12 is connected to the pull-up node PU, and a second electrode of the second touch control transistor M12 is connected to the second power supply terminal VGL.

In one embodiment, the pull-up control sub-circuit 120 comprises a pull-up control transistor M1, wherein a gate of the pull-up control transistor M1 is connected to the first node PH, a first electrode of the pull-up control transistor M1 is connected to the first power supply terminal VDD, and a second electrode of the pull-up control transistor M1 is connected to the pull-up node PU.

When the touch control keeping signal terminal TP_SW is input the touch control keeping signal, the shift register unit 200 according to the present disclosure controls the first touch control transistor M4 and the second touch control transistor M12 to be turned on through the touch control keeping signal, so that the pull-up node PU and the output terminal Output_N can be pulled down to the low level input by the second power supply terminal VGL.

Figure 3:
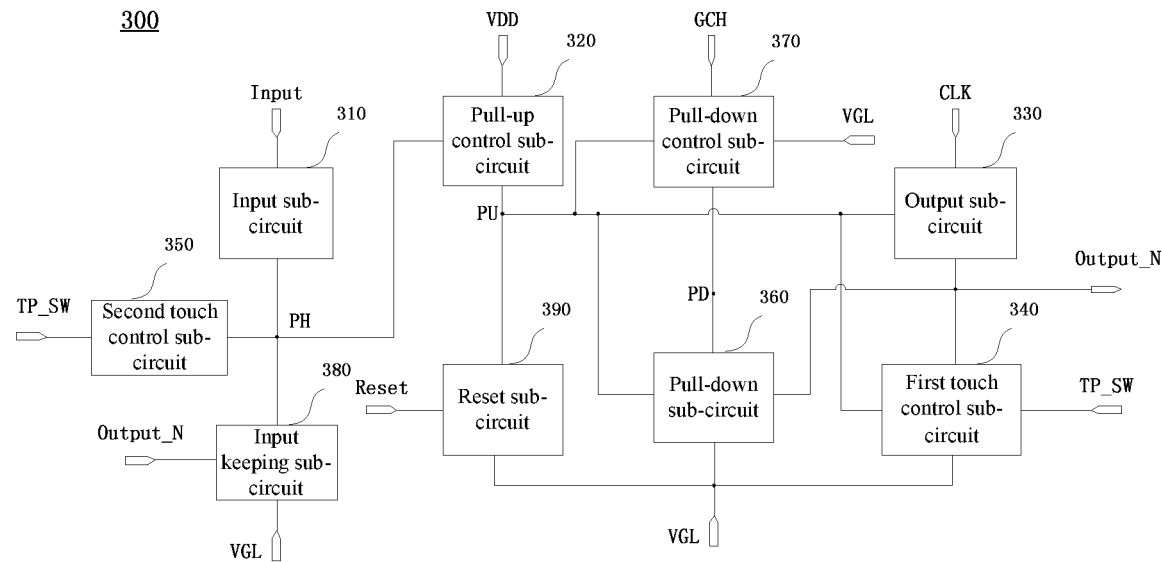
FIG. 3 illustrates a schematic block diagram of a shift register unit according to some embodiments of the present disclosure.

FIG. 3 illustrates a schematic block diagram of a shift register unit according to an embodiment of the present disclosure. An input sub-circuit 310, a pull-up control sub-circuit 320, an output sub-circuit 330, and a first touch control sub-circuit 340 as shown in FIG. 3 have structures as the same as the input sub-circuit 110, the pull-up control sub-circuit 120, the output sub-circuit 130 and the first touch control sub-circuit 140 as shown in FIGS. 1 and 2, and thus no further details are given herein.

As shown in FIG. 3, the shift register unit 300 can further comprise: an input keeping sub-circuit 380, wherein a first terminal of the input keeping sub-circuit 380 is connected to the first node PH, a second terminal of the input keeping sub-circuit 380 is connected to the second power supply terminal VGL, and the input keeping sub-circuit 380 is configured to keep the level of the first node PH during the touch and control period. In one embodiment, the input keeping sub-circuit 380 further comprises a third terminal, wherein the third terminal of the input keeping sub-circuit 380 is connected to the output terminal Output_N.

The shift register unit 300 can further comprise: a second touch control sub-circuit 350, wherein a first terminal of the second touch control sub-circuit 350 is connected to the touch control keeping signal terminal TP_SW, a second terminal of the second touch control sub-circuit 350 is connected to the first node PH, and the second touch control sub-circuit 350 is configured to output the touch control keeping signal of the touch control keeping signal terminal TP_SW to the first node PH under the control of the touch control keeping signal, so as to further keep the potential of the first node PH under the control of the touch control keeping signal.

The shift register unit 300 can further comprise: a pull-down control sub-circuit 370, wherein a first terminal of the pull-down control sub-circuit 370 is connected to the pull-up node PU, a second terminal of the pull-down control sub-circuit 370 is connected to the second power supply terminal VGL, and a third terminal of the pull-down control sub-circuit 370 is connected to the third power supply terminal GCH, and the pull-down control sub-circuit 370 is configured to control the level of the pull-down node PD; a pull-down sub-circuit 360, wherein a first terminal of the pull-down sub-circuit 360 is connected to the pull-down node PD, a second terminal of the pull-down sub-circuit 360 is connected to the pull-up node PU, a third terminal of the pull-down sub-circuit 360 is connected to the output terminal Output_N, and a fourth terminal of the pull-down sub-circuit 360 is connected to the second power supply terminal VGL, and the pull-down sub-circuit 360 is configured to pull down the levels of the pull-up node PU and the output terminal Output_N to the potential of the second power supply terminal VGL through the second power supply terminal VGL under the control of the potential of the pull-down node PD.

The shift register unit 300 can further comprise: a reset sub-circuit 390, wherein a first terminal of the reset sub-circuit 390 is connected to a reset signal terminal Reset, a second terminal of the reset sub-circuit 390 is connected to the pull-up node PU, and a third terminal thereof is connected to the second power supply terminal VGL, and the reset sub-circuit 390 is configured to reset the pull-up node PU under the control of a potential of the reset signal terminal Reset.

The shift register unit 300 according to the present disclosure is capable of not only keeping the output terminal Output_N and the pull-up node PU to be pulled down to the low level during the touch control period of time by utilizing the pull-down sub-circuit and the first touch control sub-circuit, so as to prevent the shift register unit from outputting the gate driving signal interfering the touch control effect during the touch control period of time, but also preserving the input signal of the shift register unit during the touch control period of time by utilizing the input keeping sub-circuit, so as to ensure the shift register unit normally outputting the gate driving signal corresponding to the kept input signal after the end of the touch control phase.

Figure 4:
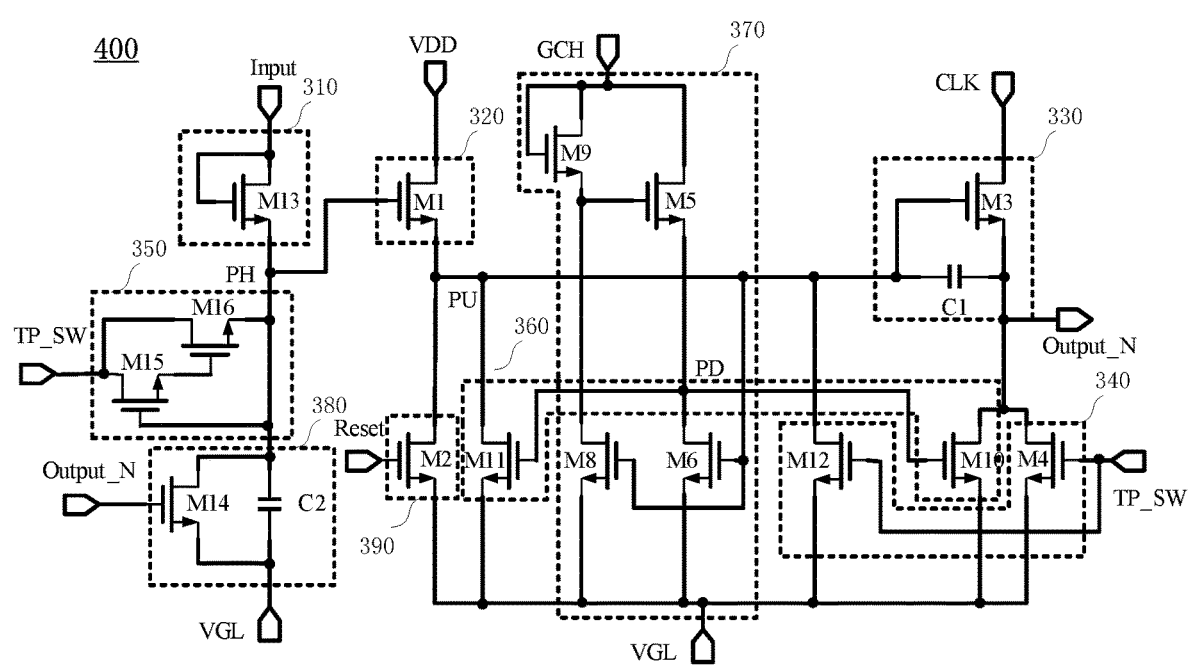
FIG. 4 illustrates an exemplary circuit structure of a shift register unit according to some embodiments of the present disclosure.

FIG. 4 illustrates an exemplary circuit structure of a shift register unit according to an embodiment of the present disclosure. The circuit structure of the shift register unit is described below in detail by combining with FIGS. 3 and 4. Herein, the input sub-circuit 310, the pull-up control sub-circuit 320, the output sub-circuit 330 and the first touch control sub-circuit 340 have structures as the same as the input sub-circuit 110, the pull-up control sub-circuit 120, the output sub-circuit 130 and the first touch control sub-circuit 140 as shown in FIG. 1, and thus no further details are given herein.

As shown in FIG. 4, in one embodiment, the input keeping sub-circuit 380 comprises an input keeping capacitor C2, wherein a first terminal of the input keeping capacitor C2 is connected to the first node PH, and a second terminal of the input keeping capacitor C2 is connected to the second power supply terminal VGL.

In one embodiment, the input keeping sub-circuit 380 can further comprise an input keeping transistor M14, wherein a gate of the input keeping transistor M14 is connected to the output terminal Output_N, a first electrode of the input keeping transistor M14 is connected to a first terminal of the input keeping capacitor C2, and a second electrode of the input keeping transistor M14 is connected to a second terminal of the input keeping capacitor C2. So, after the output terminal Output_N of the shift register unit 400 outputs a gate driving signal, the input keeping capacitor C2 is discharged through the input keeping transistor M14, so as to avoid accumulation of charges at the keeping capacitor C2 from making negative effects on subsequent operations of the shift register unit 400.

In one embodiment, the second touch control sub-circuit 350 comprises a third touch control transistor M15, and a fourth touch control transistor M16, wherein a gate of the third touch control transistor M15 is connected to the first node PH, a first electrode of the third touch control transistor M15 is connected to the touch control keeping signal terminal TP_SW, and a second electrode of the third touch control transistor M15 is connected to a gate of the fourth touch control transistor M16, and a first electrode of the fourth touch control transistor M16 is connected to the touch control keeping signal terminal TP_SW, and a second electrode of the fourth touch control transistor M16 is connected to the first node PH.

In one embodiment, the pull-down control sub-circuit 370 comprises a first pull-down control transistor M9, a second pull-down control transistor M5, a third pull-down control transistor M8, and a fourth pull-down control transistor M6, wherein a gate of the first pull-down control transistor M9 is connected to a first electrode and is connected to the third power supply terminal GCH, a second electrode of the first pull-down control transistor M9 is connected to a gate of the second pull-down control transistor M5, and is connected to a first electrode of the third pull-down control transistor M8; a first electrode of the second pull-down control transistor M5 is connected to the third power supply terminal GCH, a second electrode of the second pull-down control transistor M5 is connected to the pull-down node PD; a gate of the third pull-down control transistor M8 is connected to the pull-up node PU, a second electrode of the third pull-down control transistor M8 is connected to the second power supply terminal VGL; a gate of the fourth pull-down control transistor M6 is connected to the pull-up node PU, a first electrode of the fourth pull-down control transistor M6 is connected to the pull-down node PD, and a second electrode of the fourth pull-down control transistor M6 is connected to the second power supply terminal VGL; the pull-down sub-circuit 360 comprises a first pull-down transistor M10 and a second pull-down transistor M11, wherein a gate of the first pull-down transistor M10 is connected to the pull-down node PD, a first electrode of the first pull-down transistor M10 is connected to the output terminal Output_N, and a second electrode of the first pull-down transistor M10 is connected to the second power supply terminal VGL; a gate of the second pull-down transistor M11 is connected to the pull-down node PD, a first electrode of the second pull-down transistor M11 is connected to the pull-up node PU, and a second electrode of the second pull-down transistor M11 is connected to the second power supply terminal VGL.

In one embodiment, the reset sub-circuit 390 comprises a reset transistor M2, wherein a gate of the reset transistor M2 is connected to the reset signal terminal Reset, a first electrode of the reset transistor M2 is connected to the pull-up node PU, and a second electrode of the reset transistor M2 is connected to the second power supply terminal VGL.

All the transistors as shown in FIGS. 2 and 4 are N type transistors, whose control electrodes are gates of the N type transistors, input electrodes are drains of the N type transistors, and output electrodes are sources of the N type transistors. However, in order to realize the principle of the present disclosure, it is possible that one or more transistors in the shift register unit adopt P type transistors, only if positions of the sources and drains as well as levels connected to the corresponding gates are adjusted correspondingly. For example, all the transistors used in the embodiments of the present disclosure are N type transistors, and thus its turn-on level is a high level, and turn-off level is a low level. If the N type transistor is replaced with the P type transistor, then its turn-on level is a low level, and turn-off level is a high level. Specific details are not given herein, but shall fall into the protection scope of the present disclosure.

According to another aspect of the present disclosure, there is further provided a driving method applicable to the shift register unit as shown in any one of FIGS. 1 to 4.

Figure 5A:
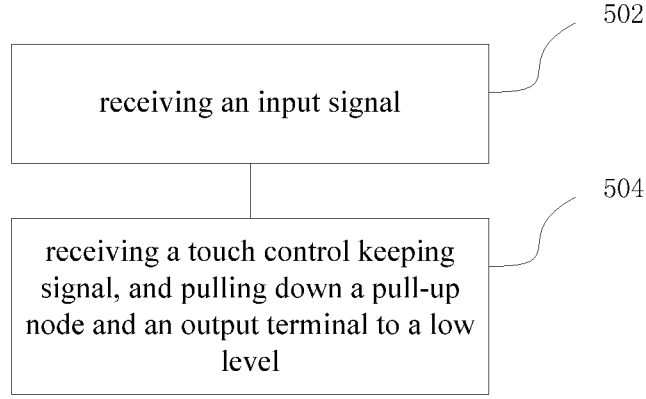
FIG. 5A is a flow diagram of a driving method applicable to a shift register unit according to some embodiments of the present disclosure.

FIG. 5A is a flow diagram of a driving method applicable to the shift register unit according to an embodiment of the present disclosure.

As shown in FIG. 5A, in step 502, an input signal is received, and the input signal is transmitted to the first node through the input sub-circuit, so as to ensure the output sub-circuit operating normally.

In step 504, a touch control keeping signal is received, and potentials of the pull-up node and the output terminal are pulled down to the low level through the first touch control sub-circuit under the control of the touch control keeping signal, so as to prevent the shift register unit from outputting signals, thereby avoiding making negative effects on the touch control operation.

Figure 5B:
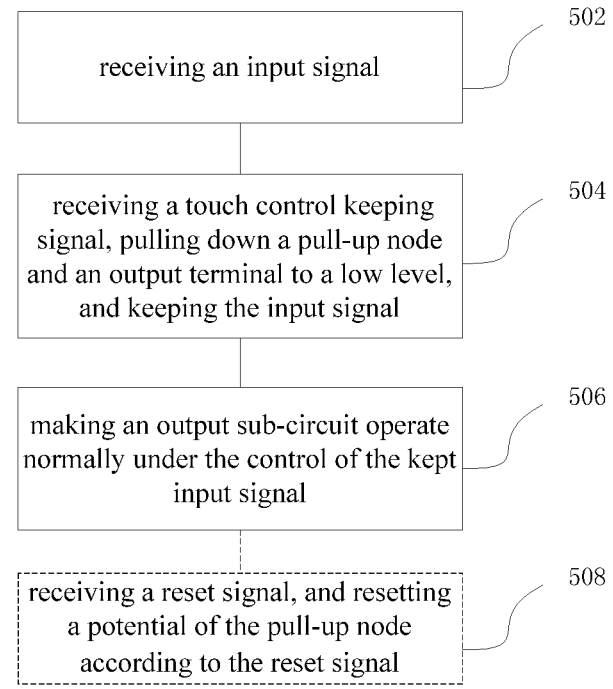
FIG. 5B is a flow diagram of a driving method applicable to a shift register unit according to some embodiments of the present disclosure.

FIG. 5B is a flow diagram of a driving method applicable to the shift register unit according to an embodiment of the present disclosure.

As shown in FIG. 5B, in step 502, an input signal is received, and the input signal is transmitted to the first node through the input sub-circuit, so as to ensure the output sub-circuit operating normally.

In step 504, a touch control keeping signal is received, and potentials of the pull-up node and the output terminal are pulled down to the low level through the first touch control sub-circuit under the control of the touch control keeping signal, so as to prevent the shift register unit from outputting unnecessary signals during the touch control period of time, thereby avoiding making negative effects on the touch control operation. Furthermore, the input signal of the shift register unit is kept in step 504.

In one embodiment, the input signal can be kept through the second touch control sub-circuit in step 504. In another embodiment, the input signal can be kept through the input keeping sub-circuit in step 504.

After that, in step 506, the level of the pull-up node is pulled up to the high level according to the input signal kept by the input keeping sub-circuit, so as to ensure the output sub-circuit is capable of operating normally.

In one embodiment, the driving method can further comprise step 508. In step 508, a reset signal is received, and the potential of the pull-up node is pulled down to the low level through the reset sub-circuit under the control of the reset signal.

In the driving method applicable to the shift register unit according to the embodiment of the present disclosure, the potentials of the pull-up node PU and the output terminal Output_N are pulled down to the low level by utilizing the first touch control sub-circuit in the touch control keeping signal input phase, so as to ensure that no unnecessary gate driving signal is output in the touch control phase. In the meantime, in the touch control keeping signal input phase, the input signal of this stage of shift register unit is preserved by utilizing the input keeping circuit, to ensure that this stage of shift register unit can output signals normally after the end of the touch control phase.

Figure 6:
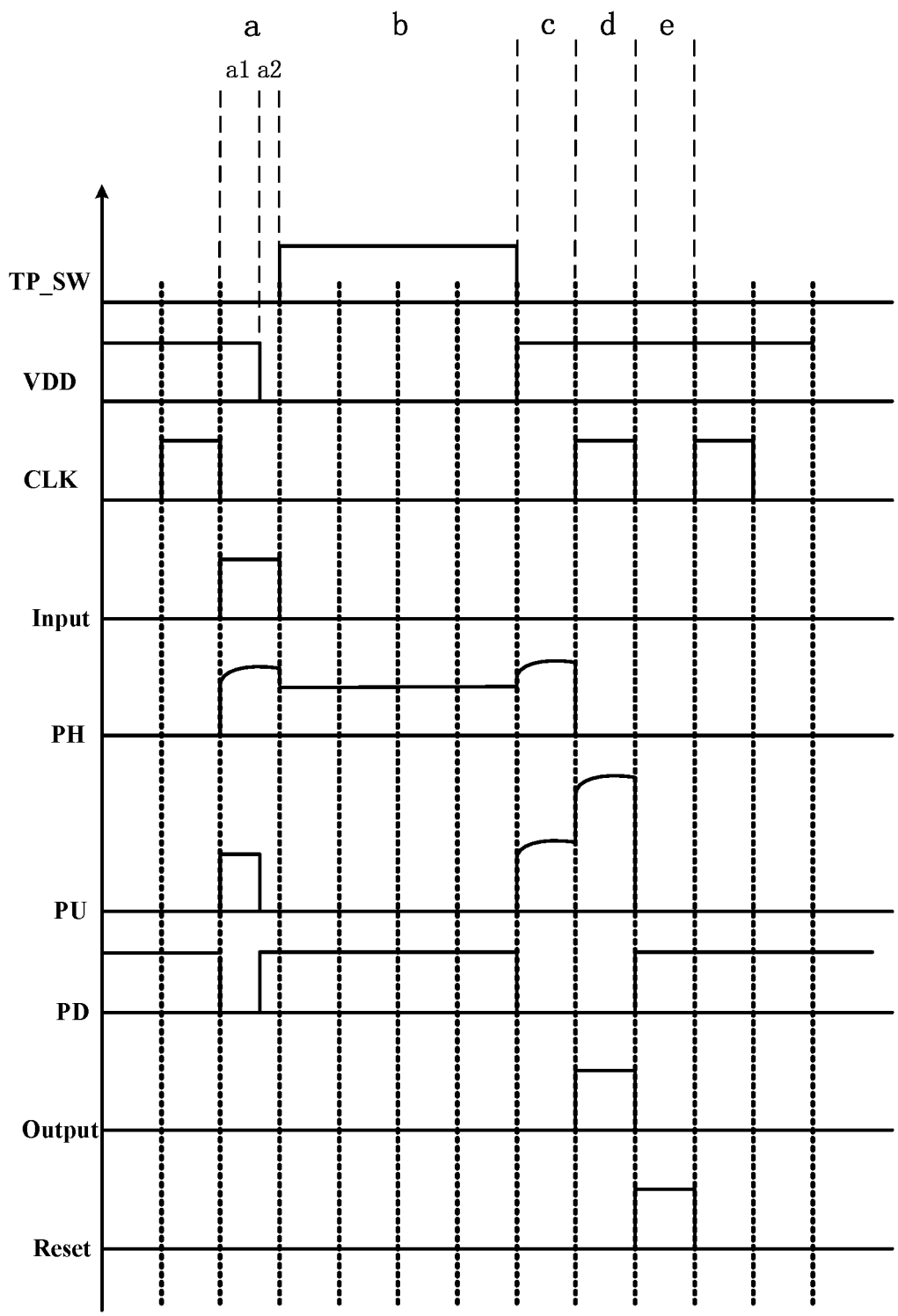
FIG. 6 illustrates related signal timings that can be used for the shift register unit as shown in FIG. 4 according to some embodiments of the present disclosure.

FIG. 6 illustrates related signal timings that can be used for the shift register unit as shown in FIG. 4 of an embodiment of the present disclosure. Operation principles of the shift register unit according to the embodiment of the present disclosure will be described below by referring to the signal timings as shown in FIG. 6 by taking the shift register unit 200 as shown in FIG. 2 being the N-th stage of shift register unit as an example. Herein, the input signal terminal Input of the shift register unit 200 is input an input signal; the first power supply terminal VDD is input a first power supply signal; the second power supply terminal VGL is input a low level; the third power supply terminal GCH is input a high level; the clock signal terminal CLK is input a clock signal; the touch control keeping signal terminal TP_SW is input a touch control keeping signal. The input signal terminal Input is connected to an output terminal OUT_N−1 of a previous stage of shift register unit of the shift register unit as shown in FIG. 2.

In an input phase a, a high level signal is input to the input signal terminal Input, a high level is input to the first power supply terminal VDD, a low level is input to the touch control keeping signal terminal TP_SW, and a low level is input to the clock signal.

The input transistor M13 is turned on under the control of the input signal, and the input signal is output to the first node PH. The pull-up control transistor M1 is turned on under the control of the potential of the first node PH, so that the signal input to the first power supply terminal VDD is transmitted to the pull-up node PU via the pull-up control transistor M1.

In a touch control phase b, the low level is input to the input signal terminal Input, the low level is input to the first power supply terminal VDD, the high level is input to the touch control keeping signal, and the low level is input to the clock signal terminal.

Under the control of the touch control keeping signal, the first touch control transistor M4 and the second touch control transistor M12 are turned on, to pull down the pull-up node PU and the output terminal Output_N to the low level input by the second signal terminal VGL.

Next, operation principles of the shift register unit according to the embodiment of the present disclosure are described with reference to the signal timings as shown in FIG. 6 by taking the shift register unit 400 shown in FIG. 4 as the N-th stage of shift register unit as an example. Herein, the input signal terminal Input of the shift register unit 400 is input the input signal; the first power supply terminal VDD is input the first power supply signal; the second power supply terminal VGL is input the low level; the clock signal terminal CLK is input the clock signal; the touch control keeping signal terminal TP_SW is input the touch control keeping signal; the third power supply terminal GCH is input the third power supply signal. The input signal terminal Input is connected to the output terminal OUT_N−1 of the previous stage of shift register unit (i.e., an (N−1)-th stage), and the reset terminal RESET is connected to an output terminal OUT_N+1 of a next stage of shift register unit (i.e., an (N+1)-th stage), that is, the scanning direction is forward scanning.

In the five phase a, b, c, d, e as shown in FIG. 6, the shift register unit 400 performs following operations:

As shown in FIG. 6, in the input phase a, the high level is input to the input signal terminal Input, the high level is input to the first power supply terminal VDD in a phase a1, and in a phase a2, the low level is input to the first power supply terminal VDD, the low level is input to the touch control keeping signal terminal TP_SW, the low level is input to the clock signal terminal CLK, and the low level is input to the reset signal terminal Reset. In the input phase a, those skilled in the art shall understand that the input signal of the first stage of shift register unit may be an initial input signal.

Figure 7:
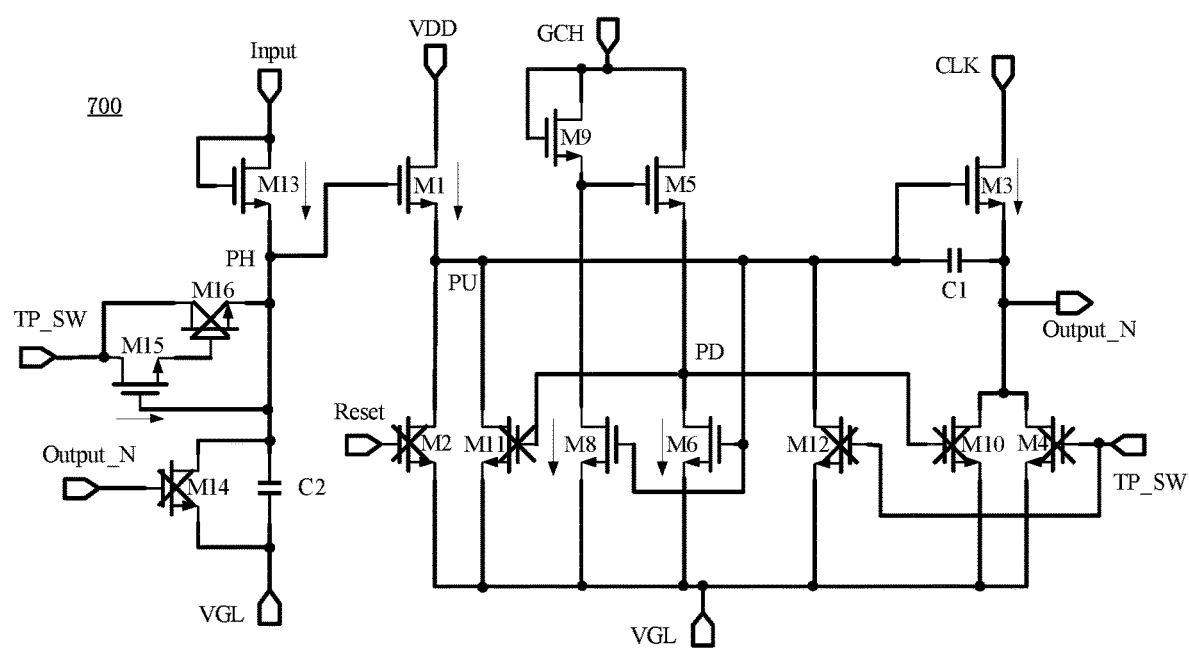
FIG. 7 illustrates an equivalent circuit diagram of the shift register unit as shown in FIG. 4 according to some embodiments of the present disclosure in an input phase a1.

FIG. 7 illustrates an equivalent circuit diagram of the shift register unit as shown in FIG. 4 according to an embodiment of the present disclosure in the phase a1. As shown in FIGS. 6 and 7, in the phase a1, under the control of the high level of the input signal, the input transistor M13 is turned on to transmit the input signal to the first node PH. This input signal is transmitted to an input keeping capacitor C2 via the first node PH, and charges the input keeping capacitor C2, so that the first node PH is charged to the high level.

According to the above description, in the phase a1, the first node PH is charged to the high level under the control of the input signal Input. Since the gate of the pull-up control transistor M1 is connected to the first node PH, and the pull-up control transistor M1 is turned on under the high level of the first node PH, so that the high level output by the first power supply terminal VDD is transmitted to the pull-up node PU via the pull-up control transistor M1. Via the pull-up node PU, the high level output by the first power supply terminal VDD charges the output capacitor C1, and pulls up the pull-up node PU to the high level. The output transistor M3 is turned on under the control of the potential of the pull-up node PU. Since the input of the clock signal terminal CLK is a low level in the phase a1, the output terminal Output_N is at a low level.

In the phase a1, the low level is input to the reset signal terminal Reset, and thus the reset transistor M2 is turned off.

In the phase a1, as described above, the pull-up node PU is pulled up to the high level. Therefore, the fourth pull-down control transistor M6 is turned on under the control of the potential of the pull-up node PU. Since the low level is input to the second power supply terminal VGL, the pull-down node PD is pulled down to the low level. For example, by designing a channel width-to-length ratio of the third pull-down control transistor M8 and the first pull-down control transistor M9, the gate of the second pull-down control transistor M5 is at a low level when the pull-up node PU is at a high level and controls the fourth pull-down control transistor M6 and the third pull-down control transistor M8 to be turned on. Therefore, the second pull-down control transistor M5 is turned off, so that the pull-down node PD is pulled down to the low level through the fourth pull-down control transistor M6. Therefore, in the phase a1, the first pull-down transistor M10 and the second pull-down transistor M11 are turned off to ensure the normal output, under the control of the potential of the pull-up node PD.

In the phase a1, since the low level is input to the touch control keeping signal terminal TP_SW, the first touch control transistor M4 and the second touch control transistor M12 are turned off under the control of the low level input by the touch control keeping signal terminal TP_SW. As described above, the first node PH is pulled up to the high level at this time, and thus the third touch control transistor M15 is turned on under the control of the potential of the first node PH. The touch control keeping signal is transmitted to the gate of the fourth touch control transistor M16 via the third touch control transistor M15. In the case that the touch control keeping signal input by the touch control keeping signal terminal TP_SW is a low level, the fourth touch control transistor M16 is turned off to ensure the normal output.

In the phase a2, the input signal of the first power supply terminal VDD becomes the low level, the low level is input to the touch control keeping signal terminal TP_SW, the low level is input to the clock signal terminal CLK, and the low level is input to the reset signal terminal Reset.

In the phase a2, since the input signal is still kept as the high level, the first node PH keeps at the high level, and controls the pull-up control transistor M1 to keep turned on. In the case that the pull-up control transistor M1 is turned on, the signal input by the first power supply terminal VDD is transmitted to the pull-up node PU via the pull-up control transistor M1. Since the first power supply terminal VDD is input the low level in the phase a2, the pull-up node PU is pulled down to the low level in the phase a2.

On the other hand, when the pull-down node PU is a low level and controls the fourth pull-down control transistor M6 and the third pull-down control transistor M8 to be turned off, the first pull-down control transistor M9 and the second pull-down control transistor M5 are turned on under the control of the potential of the third power supply terminal GCH, so that the pull-down node PD is pulled up to the high level. Under the control of the potential of the pull-down node PD, the first pull-down transistor M10 and the second pull-down transistor M11 are turned on, and further the pull-up node PU is kept at the low level.

It shall be understood that in another embodiment, the first power supply terminal VDD is input the first power supply signal, and would jump with the touch control keeping signal terminal TP_SW being input the touch control keeping signal at the same time. In this case, the first power supply terminal VDD is always input the high level in the input phase a. That is, the phase a2 can be omitted in the input phase a, and only comprises the phase a1. In this case, by designing the channel width-to-length ratio of the pull-up control transistor M1 and the second touch control transistor M12, the first power supply terminal VDD and the touch control keeping signal terminal TP_SW have a jump at the same time. Even if there is a delay signal, the pull-up node PU can be pulled down to the low level in time.

As shown in FIG. 6, in the touch control phase b, the low level is input to the input signal terminal Input, the low level is input to the first power supply terminal VDD, and the low level is input to the clock signal terminal CLK, the low level is input to the second power supply terminal VGL, the low level is input to the reset signal terminal Reset, the high level is input to the touch control keeping signal terminal TP_SW.

Figure 8:
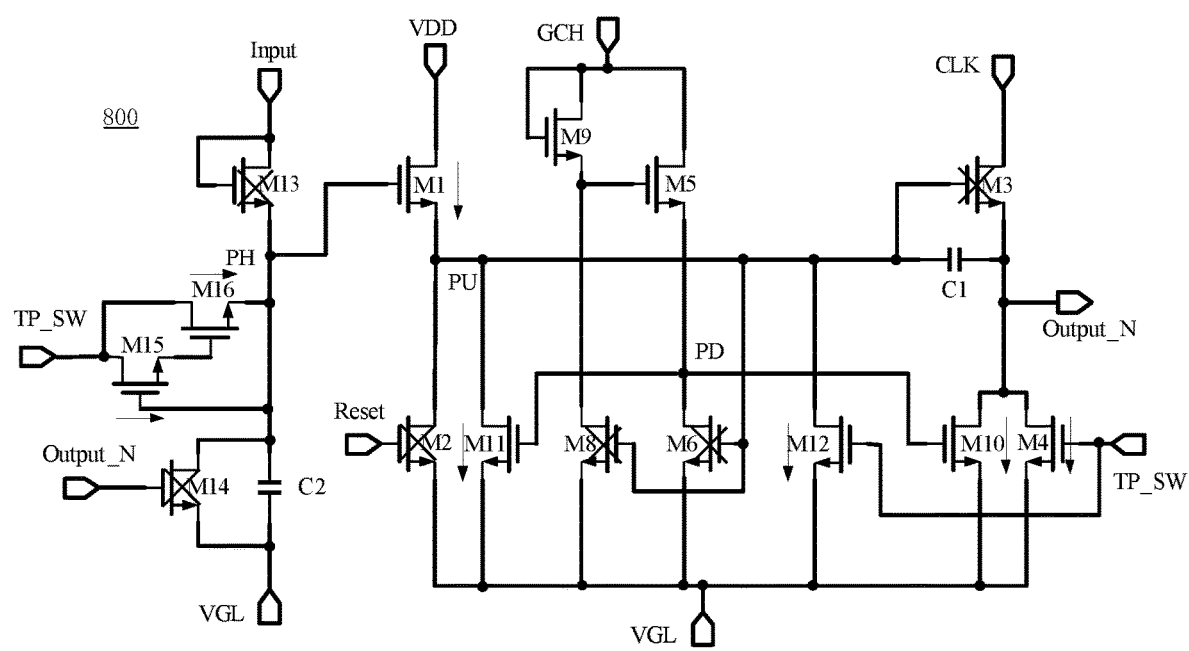
FIG. 8 illustrates an equivalent circuit diagram of the shift register unit as shown in FIG. 4 according to some embodiments of the present disclosure in a second phase b.

FIG. 8 illustrates an equivalent circuit diagram of the shift register unit as shown in FIG. 4 of the embodiment of the present disclosure in a touch control phase b. By referring to FIGS. 6 and 8, as described above, since the first node PH keeps in a high level state in the input phase a, the first node PH is still in the high level state when the input signal becomes from the high level into the low level, and the touch control keeping signal becomes from the low level into the high level. Therefore, the third touch control transistor M15 is in a turn-on state. Since the first power supply terminal VDD is at a low level at this time, the potential of the pull-up node PU is pulled down to the low level through the pull-up control transistor M1.

On the other hand, when the touch control keeping signal becomes from the low level into the high level, the first touch control transistor M4 and the second touch control transistor M12 are turned on so as to pull down the pull-up node PU and the output terminal Output_N to the low level input by the second signal terminal VGL. Thus, it is ensured in the touch control period of time that the gate driving signal would not influence the touch.

Additionally, when the touch control keeping signal becomes from the low level into the high level, the touch control keeping signal is transmitted to the gate of the fourth touch control transistor M16 via the turned-on third touch control transistor M15, and controls the fourth touch control transistor M16 to be turned on. In the case that the fourth touch control transistor M16 is turned on, the touch control keeping signal is transmitted to the first node PH via the fourth touch control transistor M16, and charges the input keeping capacitor C1. Therefore, in the touch control phase b, the first node PH keeps in the high level state under the control of the input touch control keeping signal.

Since the pull-up node PU is pulled down to the low level, the third pull-down control transistor M8 and the fourth pull-down control transistor M6 are turned off under the control of the potential of the pull-up node PU. At this time, the potential of the pull-down node PD is a high level, and under the control of the potential of the pull-down node PD, the first pull-down transistor M10 and the second pull-down transistor M11 are turned on to keep the pull-up node PU and the output terminal Output_N in the low level state.

In the touch control phase b, since the output terminal Output_N is kept at a low level, the input keeping transistor M14 is always turned off, so that the voltage over the input keeping capacitor C1 is kept, and thus the first node PH is kept at a high level.

It shall be understood that in another embodiment, the first power supply signal input by the first power supply terminal VDD is always a high level signal. In this case, by designing the channel width-to-length radio of the pull-up control transistor M1 and the second touch control transistor M12, the pull-up node PU is pulled down to the low level when the touch control keeping signal TP_SW controls the second touch control transistor M12 to be turned on.

As shown in FIG. 6, in a recovery phase c, the low level is input to the input signal terminal Input, the high level is input to the first power supply terminal VDD, and the low level is input to the clock signal terminal CLK, the low level is input to the second power supply terminal VGL, the low level is input to the reset signal terminal Reset, and the low level is input to the touch control keeping signal terminal TP_SW.

Figure 9:
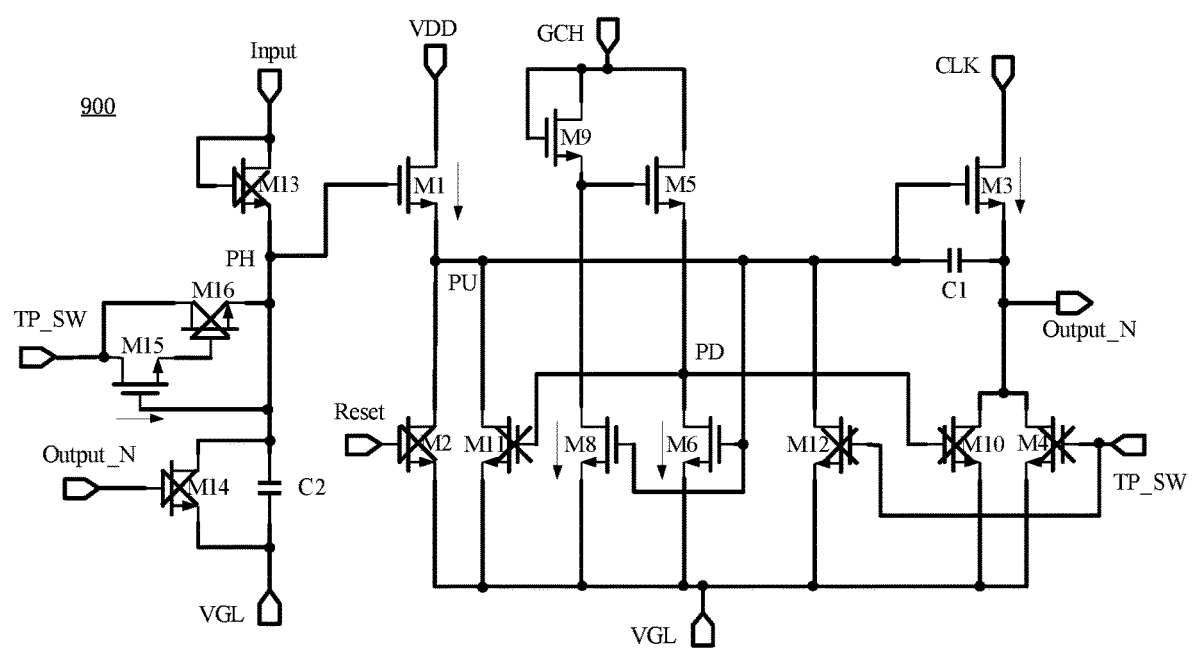
FIG. 9 illustrates an equivalent circuit diagram of the shift register unit as shown in FIG. 4 according to some embodiments of the present disclosure in a recovery phase c.

FIG. 9 illustrates an equivalent circuit diagram of the shift register unit as shown in FIG. 4 of the embodiment of the present disclosure in the recovery phase c. By referring to FIGS. 6 and 9, due to the holding function of the input keeping capacitor C2, the pull-up control transistor M1, and the third touch control transistor M15 are turned on. Since the touch control keeping signal TP_SW is a low level, the fourth touch control transistor M16 is turned off.

In the recovery phase, since the first power supply terminal VDD is recovered to the high level, the pull-up control transistor M1 transmits the high level signal of the first power supply terminal VDD to the pull-up node PU, and charges the output capacitor C1 via the pull-up node PU.

As described above, after the output capacitor C1 is charged, the pull-up node PU is pulled up to the high level. Under the control of the potential of the pull-up node PU, the third pull-down control transistor M8 and the fourth pull-down control transistor M6 are turned on, to pull down the pull-down node PD to the low level input by the second power supply terminal VGL. Under the control of the potential of the pull-down node PD, the first pull-down transistor M10 and the second pull-down transistor M11 are turned off, so as to ensure that the output terminal of the shift register unit outputs the signal of the clock signal terminal normally.

In the recovery phase c, since the touch control keeping signal input by the touch control keeping signal terminal TP_SW is a low level, the first touch control transistor M4 and the second touch control transistor M12 are turned off, which also ensures that the output terminal of the shift register unit outputs normally.

As described above, in the recovery phase c, since the keeping capacitor C2 keeps the input signal, and the first power supply terminal VDD is recovered to the high level, the pull-up node PU is again pulled up to the high level, so that the operation state of the shift register unit is recovered to a state where the VDD jumps to a low level and the touch control signal occurs.

Additionally, the output transistor M3 is turned on under the control of the potential of the pull-up node PU. Since the clock signal input by the clock signal terminal CLK is a low level, the output terminal Output_N is kept at a low level.

As shown in FIG. 6, in an output phase d, the low level is input to the input signal terminal Input, the high level is input to the first power supply terminal VDD, and the high level is input to the clock signal terminal CLK, the low level is input to the second power supply terminal VGL, the low level is input to the reset signal terminal Reset, and the low level is input to the touch control signal terminal TP_SW.

Figure 10:
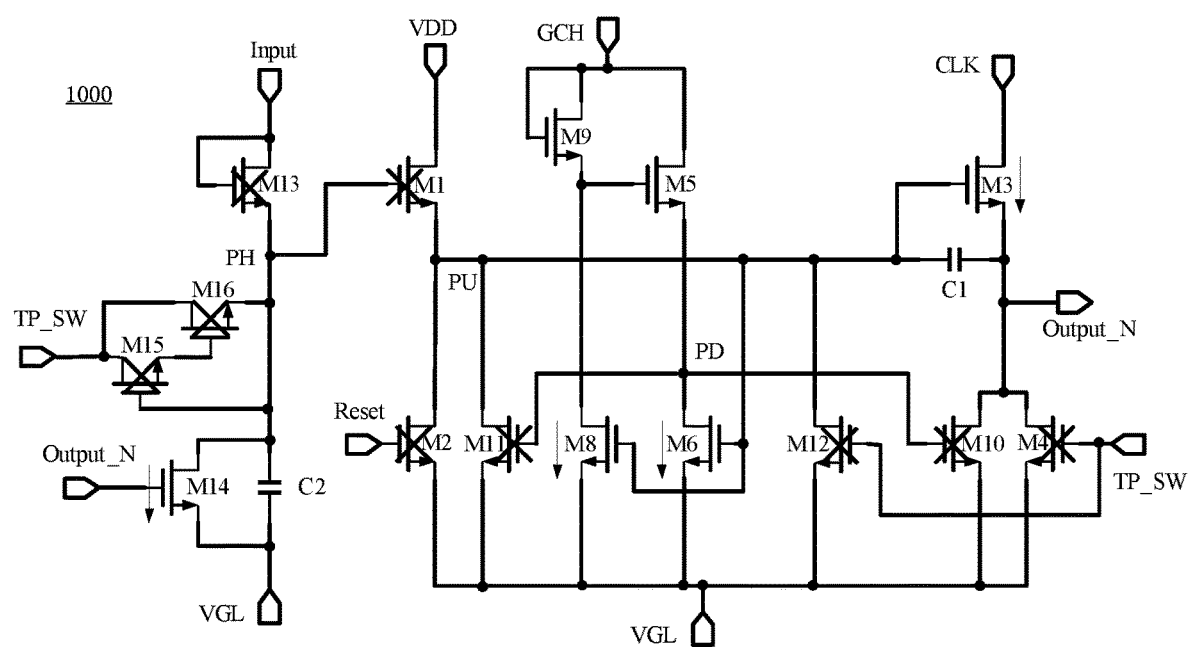
FIG. 10 illustrates an equivalent circuit diagram of the shift register unit as shown in FIG. 4 according to some embodiments of the present disclosure in an output phase d.

FIG. 10 illustrates an equivalent circuit diagram of the shift register unit as shown in FIG. 4 of the embodiment of the present disclosure in an output phase d. By referring to FIGS. 6 and 10, as described above, in the recovery phase c, the pull-up node PU is kept at a high level potential through the high level output by the first power supply terminal VDD, and thus the M3 keeps turned on under the control of the potential of the pull-up node PU.

In the output phase d, since the clock signal terminal CLK is input the high level, the high level input by the clock signal terminal CLK is transmitted to the output terminal Output_N via the output transistor M3, and is output as an output signal. At the same time, due to the bootstrapping effect of the output capacitor C1, the potential of the pull-up node PU is further pulled up.

Additionally, since the output terminal Output_N is pulled up to the high level, the input keeping transistor M14 is turned on, and the input keeping capacitor C2 is discharged. The first node PH is pulled down to the low level, so that the pull-up control transistor M1 is turned off.

As shown in FIG. 6, in the reset phase e, the low level is input to the input signal terminal Input, the high level is input to the first power supply terminal VDD, and the low level is input to the clock signal terminal CLK, the low level is input to the second power supply terminal VGL, the high level is input to the reset signal terminal Reset, and the low level is input to the touch control keeping signal TP_SW.

Figure 11:
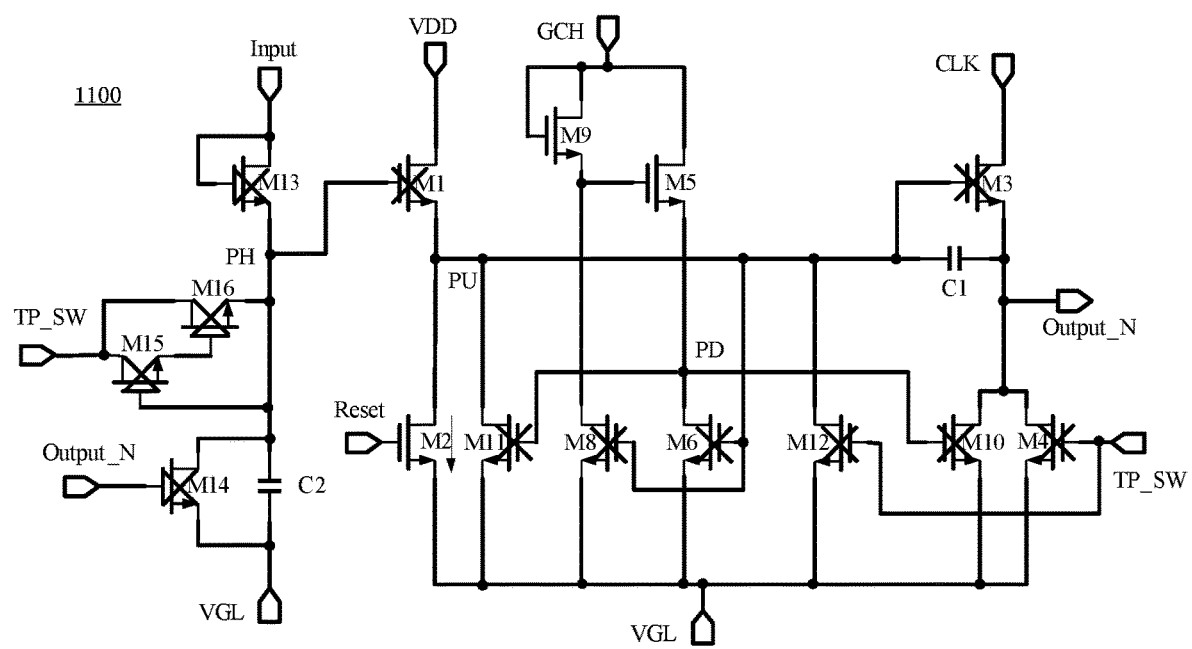
FIG. 11 illustrates an equivalent circuit diagram of the shift register unit as shown in FIG. 4 according to some embodiments of the present disclosure in a reset phase e.

FIG. 1/ illustrates an equivalent circuit diagram of the shift register unit as shown in FIG. 4 of the embodiment of the present disclosure in a reset phase e. By referring to FIGS. 5 and 11, in the reset phase e, as described above, the first node PH has been recovered to the low level in the output phase d, the pull-up control transistor M1 is turned off, and thus the high level output by the first power supply terminal VDD cannot be transmitted to the node PU.

Since the high level is input the reset signal terminal Reset to control the reset transistor M2 to be turned on. Therefore, the level of the pull-up node PU is pulled down to the low level input by the second power supply terminal VGL.

During inputting of the touch control keeping signal, the shift register unit according to the present disclosure can keep the output terminal Output_N and the pull-up node PU at the low level through the first touch control transistor M4 and the second touch control transistor M12 under the control of the touch control keeping signal, which prevents the output terminal Output_N from outputting signals, prevents the gate driving signal of the shift register unit from making negative effects on the touch circuit, and avoids an abnormal gate driving signal which is likely to be caused by the leakage problem of the output capacitor C1. Additionally, the output terminal Output_N and the pull-up node PU can be further kept as the low level through the first pull-down transistor M10 and the second pull-down transistor M11. Further, the touch control keeping signal input in the touch phase is stored through the input keeping capacitor C2, so that the present stage of shift register unit can normally output the driving signal of this stage after the end of the touch phase.

Figure 12:
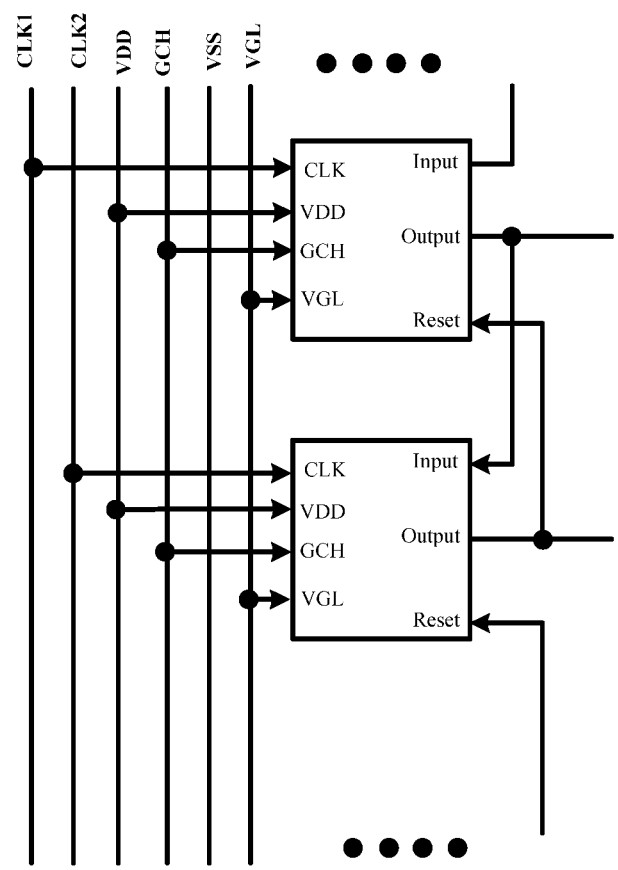
FIG. 12 is a gate driving circuit that applies a shift register unit according to some embodiments of the present disclosure.

According to another aspect of the present disclosure, there is further provided a gate driving circuit. As shown in FIG. 12, the gate driving circuit comprises a plurality of stages of shift register units connected in cascades, wherein any stage or multiple stages of shift register units can adopt the structure of the shift register unit as shown in one of FIGS. 1 to 4. For example, all the multiple stages of shift register units connected in cascades in the gate driving circuit adopt the structure of the shift register unit as described above.

FIG. 12 is a gate driving circuit that applied the shift register unit according to an embodiment of the present disclosure. As shown in FIG. 12, herein, an output terminal OUTPUT of a first stage of shift register unit is connected to an input signal terminal Input of a second stage of shift register unit, an output terminal OUTPUT of a last stage of shift register unit is connected to a reset terminal RESET of a second stage of shift register unit from the end; except the first stage of shift register unit, an output terminal OUTPUT of each stage of shift register unit is further connected to a reset terminal RESET of a previous stage of shift register unit, and except a last stage of shift register unit, the output terminal OUTPUT of each stage of shift register unit is further connected to an input signal terminal Input of a next stage of shift register unit, that is, for an N-th stage of shift register unit, its input signal terminal Input is connected to an output terminal OUTPUT of a (N−1)-th stage of shift register unit, and reset terminal RESET is connected to an output terminal OUTPUT of an (N+1)-th stage of shift register unit. A clock signal terminal CLK of the N-th stage of shift register unit is connected to a first clock signal terminal CLK1, and a clock signal terminal CLK of the (N+1)-th stage of shift register unit is connected to a second clock signal terminal CLK2, wherein phases of the first clock signal CLK1 and the second clock signal CLK2 have a difference of 180 degrees and levels thereof are opposite. Additionally, it can be understood that the N stages of shift register units connected in cascades can be connected to a same touch control keeping signal terminal TP_SW, or can be connected to different touch control keeping signal terminals TP_SW.

Embodiments of the present disclosure also comprise a display substrate, a display panel and a display apparatus that apply the gate driving circuit described above. Herein, the touch control keeping signal output by the touch control keeping signal terminal TP_SW is a pulse signal, and its effective level period of time is consistent with an effective level period of time of a touch control signal transmitted in the display panel or the display panel or the display apparatus.

In the gate driving circuit comprising the N stages of shift register units as described above, any stage or multiple stages of shift register units can adopt the shift register unit according to any embodiments of the present disclosure as described above. In addition, in the touch phase of the gate driving circuit, the stage or multiple stages of shift register units can receive the touch control keeping signal and execute operations in respective phases as shown in FIG. 5. The remaining stages of shift register units can keep their normal operations.

In the touch phase, when the shift register unit in the gate driving circuit according to the embodiment of the present disclosure receive the touch control keeping signal, the potential of the output terminal is pulled down to the low potential through the first touch control sub-circuit and/or the pull-down sub-circuit, so as to avoid outputting the gate driving signal in the touch phase. Further, the input signal is kept through the input keeping sub-circuit, so that the normal operation of the shift register unit is recovered in the touch period of time.

There is further provided according to at least one embodiment of the present disclosure a display apparatus, comprising the gate driving circuit provided in the embodiment of the present disclosure. The display apparatus can be any product or means having the function of displaying such as a mobile phone, a tablet computer, a television set, a display, a notebook computer, a digital photo frame, a navigator, etc.

Unless otherwise defined, all the terms (including technic and scientific terms) used herein have the same meanings commonly understood by those ordinary skilled in the art. It shall be understood that those terms generally defined in a dictionary shall be interpreted as having meanings consistent with the meanings in the context of the related technology, but shall not be interpreted as ideal or extremely formal meanings, unless explicitly defined.

The above are description of the present disclosure, but shall not be deemed as limitations thereto. Although several exemplary embodiments of the present disclosure are described, it is easy for those skilled in the art o understand that many amendments can be made to the exemplary embodiments without departing from novel teachings and advantages of the present disclosure. Therefore, all these amendments shall intend to fall into the scope of the disclosure as defined in the Claims. It shall be understood that the above are descriptions of the present disclosure, but shall not be considered as being limited to the specific embodiments as disclosed, and any amendment made to the embodiments of the present disclosure or other embodiments intends to fall into the scope of the Claims attached herein. The present disclosure is defined by the Claims and their equivalents.

What is claimed is:

1. A shift register unit, comprising:
    an input sub-circuit, configured to output an input signal to a first node (PH);
    a pull-up control sub-circuit having a first terminal connected to the first node (PH), a second terminal connected to a pull-up node (PU), and a third terminal connected to a first power supply terminal (VDD), and configured to charge the pull-up node (PU) through the first power supply terminal (VDD) under the control of a potential of the first node (PH);
    an output sub-circuit having a first terminal connected to the pull-up node (PU), a second terminal connected to a clock signal terminal (CLK), and a third terminal connected to an output terminal, and configured to output a clock signal of the clock signal terminal (CLK) to the output terminal under the control of a potential of the pull-up node (PU);
    a first touch control sub-circuit having a first terminal connected to a touch control keeping signal terminal, a second terminal connected to the pull-up node PU, a third terminal connected to the output terminal, and a fourth terminal connected to a second power supply terminal (VGL), and configured to pull down levels of the pull-up node (PU) and the output terminal to a second potential through the second power supply terminal (VGL) under the control of a touch control keeping signal of the touch control keeping signal terminal;

an input keeping sub-circuit having a first terminal connected to the first node (PH), a second terminal connected to the second power supply terminal (VGL), and configured to maintain the level of the first node (PH), and a third terminal connected to the output terminal, and a second touch control sub-circuit having a first terminal connected to the touch control keeping signal terminal, and a second terminal connected to the first node (PH), and configured to output the touch control keeping signal of the touch control keeping signal terminal to the first node (PH) under the control of the touch control keeping signal of the touch control keeping signal terminal.

2. The shift register unit according to claim 1, further comprising:
a pull-down control sub-circuit having a first terminal connected to the pull-up node (PU), a second terminal connected to the second power supply terminal (VGL), and a third terminal connected to a third power supply terminal (GCH), and configured to control a level of a pull-down node (PD);
a pull-down sub-circuit having a first terminal connected to the pull-down node (PD), a second terminal connected to the pull-up node (PU), a third terminal connected to the output terminal, and a fourth terminal connected to the second power supply terminal (VGL), and configured to pull down levels of the pull-up node (PU) and the output terminal to the second potential through the second power supply terminal (VGL) under the control of a potential of the pull-down node (PD).

3. The shift register unit according to claim 1, further comprising:
a reset sub-circuit having a first terminal connected to a reset signal terminal (Reset), a second terminal connected to the pull-up node (PU), and a third terminal connected to the second power supply terminal (VGL), and configured to reset the pull-up node (PU) under the control of a potential of the reset signal terminal.

4. The shift register unit according to claim 1, wherein, the first touch control sub-circuit comprises a first touch control transistor (M4), and a second touch control transistor (M12), wherein
a gate of the first touch control transistor is connected to the touch control keeping signal terminal, a first electrode of the first touch control transistor is connected to the output terminal, and a second electrode of the first touch control transistor is connected to the second power supply terminal (VGL), and
a gate of the second touch control transistor is connected to the touch control keeping signal terminal, a first electrode of the second touch control transistor is connected to the pull-up node (PU), and a second electrode of the second touch control transistor is connected to the second power supply terminal (VGL).

5. The shift register unit according to claim 1, wherein, the input keeping sub-circuit comprises an input keeping capacitor (C2), and an input keeping transistor (M14), wherein a first terminal of the input keeping capacitor (C2) is connected to the first node (PH), and a second terminal of the input keeping capacitor (C2) is connected to the second power supply terminal (VGL); a gate of the input keeping transistor (M14) is connected to the output terminal, a first electrode of the input keeping transistor (M14) is connected to the first terminal of the input keeping capacitor (C2), and a second electrode of the input keeping transistor (M14) is connected to the second terminal of the input keeping capacitor (C2).

6. The shift register unit according to claim 1, wherein, the second touch control sub-circuit comprises a third touch control transistor (M15), and a fourth touch control transistor (M16), wherein a gate of the third touch control transistor (M15) is connected to the first node (PH), a first electrode of the third touch control transistor (M15) is connected to the touch control keeping signal terminal, and a second electrode of the third touch control transistor (M15) is connected to a gate of the fourth touch control transistor (M16), and a first electrode of the fourth touch control transistor (M16) is connected to the touch control keeping signal, and a second electrode of the fourth touch control transistor (M16) is connected to the first node (PH).

7. The shift register unit according to claim 1, wherein,
the pull-up control sub-circuit comprises a pull-up control transistor (M1), wherein
a gate of the pull-up control transistor (M1) is connected to the first node (PH), a first electrode of the pull-up control transistor (M1) is connected to the first power supply terminal (VDD), and a second electrode of the pull-up control transistor (M1) is connected to the pull-up node (PU).

8. The shift register unit according to claim 1, wherein,
the input sub-circuit comprises an input transistor (M13), wherein
a gate of the input transistor (M13) is connected to its first electrode and connected to the input terminal;
the output sub-circuit comprises an output transistor (M3) and an output capacitor (C1), wherein
a gate of the output transistor (M3) is connected to a first terminal of the output capacitor and connected to the pull-up node (PU), a second terminal of the output transistor (M3) is connected to a second terminal of the output capacitor and connected to the output terminal, and the second terminal of the output transistor (M3) is connected to the clock signal terminal (CLK).

9. The shift register unit according to claim 2, wherein,
the pull-down control sub-circuit comprises a first pull-down control transistor (M9), a second pull-down transistor (M5), a third pull-down control transistor (M8), and a fourth pull-down control transistor (M6), wherein
a gate of the first pull-down control transistor (M9) is connected to its first electrode and connected to the third power supply terminal (GCH), a second electrode of the first pull-down control transistor (M9) is connected to a gate of the second pull-down transistor (M5), and connected to a first electrode of the third pull-down control transistor (M8);
a first electrode of the second pull-down control transistor (M5) is connected to the third power supply terminal (GCH), and a second electrode of the second pull-down control transistor (M5) is connected to the pull-down node (PD);
a gate of the third pull-down control transistor (M8) is connected to the pull-up node (PU), and a second electrode of the third pull-down control transistor (M8) is connected to the second power supply terminal (VGL);

a gate of the fourth pull-down control transistor (M6) is connected to the pull-up node (PU), a first electrode of the fourth pull-down control transistor (M6) is connected to the pull-down node (PD), and a second electrode of the fourth pull-down control transistor (M6) is connected to the second power supply terminal (VGL);

the pull-down sub-circuit comprises a first pull-down transistor (M10) and a second pull-down transistor (M11), wherein a gate of the first pull-down transistor (M10) is connected to the pull-down node (PD), a first electrode of the first pull-down transistor (M10) is connected to the output terminal, and a second electrode of the first pull-down transistor (M10) is connected to the second power supply terminal (VGL);

a gate of the second pull-down transistor (M11) is connected to the pull-down node (PD), a first electrode of the second pull-down transistor (M11) is connected to the pull-up node (PU), and a second electrode of the second pull-down transistor (M11) is connected to the second power supply terminal (VGL).

10. The shift register unit according to claim 3, wherein, the reset sub-circuit comprises a reset transistor (M2), wherein a gate of the reset transistor (M2) is connected to the reset signal terminal, a first electrode of the reset transistor (M2) is connected to the pull-up node (PU), and a second electrode of the reset transistor (M2) is connected to the second power supply terminal (VGL).

11. A gate driving circuit, comprising N stages of shift register units connected in cascades, the shift register unit being the shift register unit according to claim 1, wherein, an input terminal of an i-th stage of shift register unit is connected to an output terminal of an (i−1)-th stage of shift register unit, an output terminal of the i-th stage of shift register unit is connected to a reset terminal of the (i−1)-th stage of shift register unit, where N is an integer greater than 2, $1 \le i \le N$;

an input terminal of a first stage of shift register unit is connected to a frame input signal control terminal;

a reset terminal of an N-th stage of shift register unit is connected to a frame reset signal control terminal.

12. A driving method of the shift register unit according to claim 1, comprising:

an input phase, during which
the input sub-circuit receives an input signal;
the input signal is output to the first node (PH) through the input sub-circuit;
the pull-up control sub-circuit charges the pull-up node (PU) through the first power supply terminal (VDD) under the control of the potential of the first node (PH);
a touch control phase, during which
the first touch control sub-circuit receives the touch control keeping signal;
the touch control keeping signal controls the first touch control sub-circuit to pull down the pull-up node (PU) and the output terminal to the second potential.

13. The driving method according to claim 12, wherein the shift register unit further comprises:

an input keeping sub-circuit, wherein a first terminal of the input keeping sub-circuit is connected to the first node (PH), and second terminal of the input keeping sub-circuit is connected to the second power supply terminal (VGL);

and in the touch control phase, the driving method further comprises:

when the first node (PH) is charged to a first potential state, the input keeping sub-circuit keeps the potential of the first node (PH) unchanged.

14. The driving method according to claim 12, wherein the shift register unit further comprises:

a second touch control sub-circuit, wherein a first terminal of the second touch control sub-circuit is connected to a touch control keeping signal terminal, and a second terminal of the second touch control sub-circuit is connected to the first node (PH);

and in the touch control phase, the driving method further comprises:

the second touch control sub-circuit receives the touch control keeping signal;

the touch control keeping signal controls the second touch control sub-circuit to keep maintain the potential of the first node (PH).

15. The driving method according to claim 12, further comprising:

a recovery phase, during which the pull-up control sub-circuit outputs a first power supply signal to the pull-up node (PU) under the control of the potential of the first node (PH); and an output phase, during which the output sub-circuit outputs a clock signal to the output terminal under the control of a potential of the pull-up node (PU).

16. The driving method according to claim 15, wherein the shift register unit further comprises:

a reset sub-circuit, wherein a first terminal of the reset sub-circuit is connected to the reset signal terminal (Reset), a second terminal of the reset sub-circuit is connected to the pull-up node (PU), and third terminal is connected to the second power supply terminal (VGL);

and the driving method further comprises:

a reset phase, during which the reset sub-circuit pulls down the pull-up node (PU) to the second potential under the control of a potential of the reset signal terminal.

17. A shift register unit, comprising:

an input sub-circuit, configured to output an input signal to a first node (PH);

a pull-up control sub-circuit having a first terminal connected to the first node (PH), a second terminal connected to a pull-up node (PU), and a third terminal connected to a first power supply terminal (VDD), and configured to charge the pull-up node (PU) through the first power supply terminal (VDD) under the control of a potential of the first node (PH);

an output sub-circuit having a first terminal connected to the pull-up node (PU), a second terminal connected to a clock signal terminal (CLK), and a third terminal connected to an output terminal, and configured to output a clock signal of the clock signal terminal (CLK) to the output terminal under the control of a potential of the pull-up node (PU);

a first touch control sub-circuit having a first terminal connected to a touch control keeping signal terminal, a second terminal connected to the pull-up node PU, a third terminal connected to the output terminal, and a fourth terminal connected to a second power supply terminal (VGL), and configured to pull down levels of the pull-up node (PU) and the output terminal to a second potential through the second power supply terminal (VGL) under the control of a touch control keeping signal of the touch control keeping signal terminal;

an input keeping sub-circuit having a first terminal connected to the first node (PH), a second terminal connected to the second power supply terminal (VGL), and configured to maintain the level of the first node (PH), and a third terminal connected to the output terminal, and a pull-down control sub-circuit having a first terminal connected to the pull-up node (PU), a second terminal connected to the second power supply terminal (VGL), and a third terminal connected to a third power supply terminal (GCH), and configured to control a level of a pull-down node (PD).

18. The shift register unit according to claim 17, further comprising: a pull-down sub-circuit having a first terminal connected to the pull-down node (PD), a second terminal connected to the pull-up node (PU), a third terminal connected to the output terminal, and a fourth terminal connected to the second power supply terminal (VGL), and configured to pull down levels of the pull-up node (PU) and the output terminal to the second potential through the second power supply terminal (VGL) under the control of a potential of the pull-down node (PD).

19. A shift register unit, comprising:
an input sub-circuit, configured to output an input signal to a first node (PH);

a pull-up control sub-circuit having a first terminal connected to the first node (PH), a second terminal connected to a pull-up node (PU), and a third terminal connected to a first power supply terminal (VDD), and configured to charge the pull-up node (PU) through the first power supply terminal (VDD) under the control of a potential of the first node (PH);

an output sub-circuit having a first terminal connected to the pull-up node (PU), a second terminal connected to a clock signal terminal (CLK), and a third terminal connected to an output terminal, and configured to output a clock signal of the clock signal terminal (CLK) to the output terminal under the control of a potential of the pull-up node (PU);

a first touch control sub-circuit having a first terminal connected to a touch control keeping signal terminal, a second terminal connected to the pull-up node PU, a third terminal connected to the output terminal, and a fourth terminal connected to a second power supply terminal (VGL), and configured to pull down levels of the pull-up node (PU) and the output terminal to a second potential through the second power supply terminal (VGL) under the control of a touch control keeping signal of the touch control keeping signal terminal;

an input keepings circuit having a first terminal connected to the first node (PH), a second terminal connected to the second power supply terminal (VGL), and configured to maintain the level of the first node (PH), and a third terminal connected to the output terminal, and a pull-down sub-circuit having a first terminal connected to the pull-down node (PD), a second terminal connected to the pull-up node (PU), a third terminal connected to the output terminal, and a fourth terminal connected to the second power supply terminal (VGL), and configured to pull down levels of the pull-up node (PU) and the output terminal to the second potential through the second power supply terminal (VGL) under the control of a potential of the pull-down node (PD).

* * * * *